United States Patent [19]

Mori et al.

[11] Patent Number: 4,530,001
[45] Date of Patent: Jul. 16, 1985

[54] HIGH VOLTAGE INTEGRATED SEMICONDUCTOR DEVICES USING A THERMOPLASTIC RESIN LAYER

[75] Inventors: Haruo Mori; Yasuo Ohno; Yutaka Ohta; Hiroshi Tanabe; Kotaro Kato, all of Tokyo, Japan

[73] Assignees: Oki Electric Industry Co., Ltd.; Nippon Telegraph & Telephone Public Corp., both of Tokyo, Japan

[21] Appl. No.: 302,351

[22] Filed: Sep. 15, 1981

[30] Foreign Application Priority Data

Sep. 29, 1980 [JP] Japan .................. 55-134224

[51] Int. Cl.³ .................. H01L 27/12; H01L 29/06; H01L 23/48
[52] U.S. Cl. .................. 357/49; 357/55; 357/68; 357/71
[58] Field of Search .................. 357/49, 55, 68, 71

[56] References Cited

U.S. PATENT DOCUMENTS

| 3,416,224 | 12/1968 | Armstrong | 357/49 |
| 3,475,664 | 10/1969 | De Vries | 357/49 |
| 4,296,428 | 10/1981 | Haraszti | 357/55 |

OTHER PUBLICATIONS

Bodendorf et al., "Active Silicon Chip Carrier", IBM Technical Disclosure Bulletin, vol. 15, (7/72), pp. 656–657.

"Integrated Photo-Coupled Semiconductor Crosspoint Switches", Proceedings of the 10th Conference on Solid State Devices, Tokyo, 1978; Japanese Journal of Applied Physics, vol. 18, (1979), Supplement 18-1, pp. 405–410.

Primary Examiner—Gene M. Munson
Attorney, Agent, or Firm—Wenderoth, Lind & Ponack

[57] ABSTRACT

The semiconductor device comprises a semiconductor substrate, a plurality of spaced active elements, for example, of a planer type formed on one surface of the substrate, and a supporting plate bonded to the opposite surface of the substrate. A groove is cut through the substrate to reach the supporting plate for isolating the active elements.

14 Claims, 8 Drawing Figures

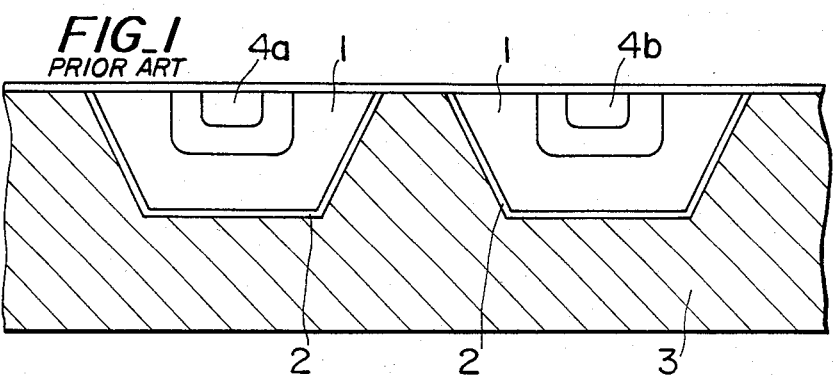
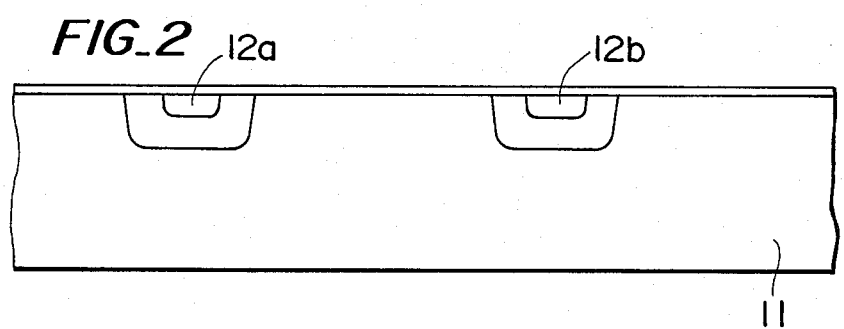
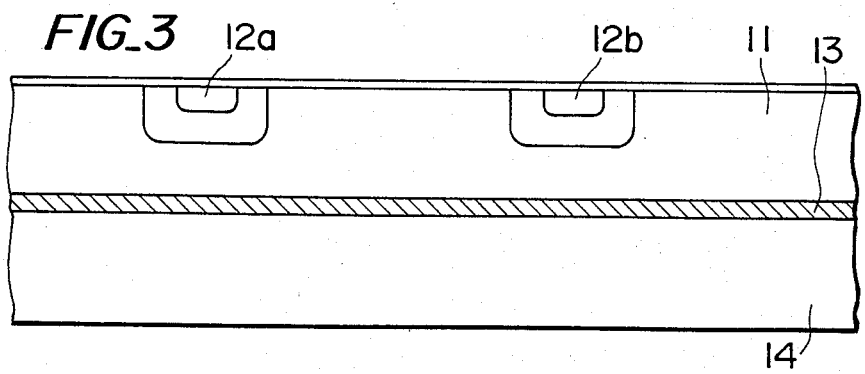

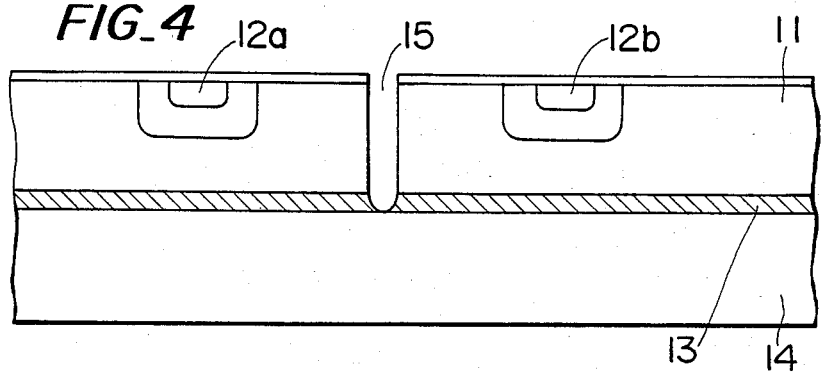
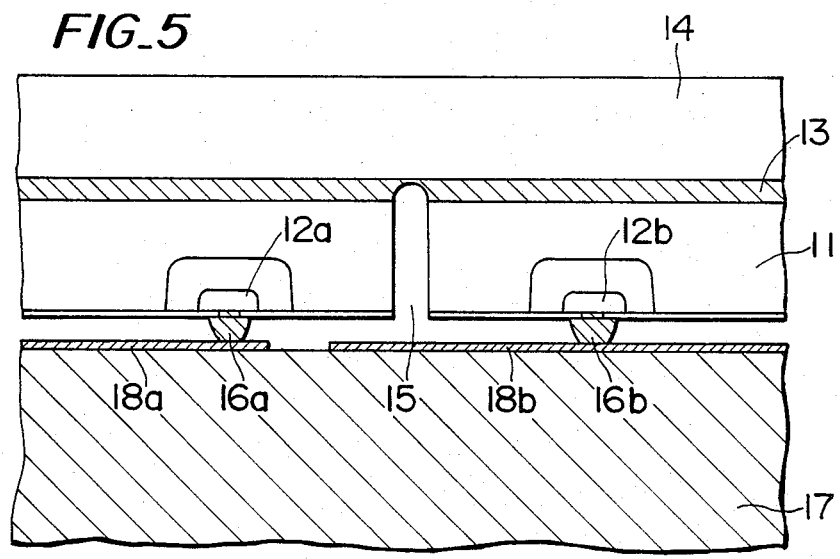

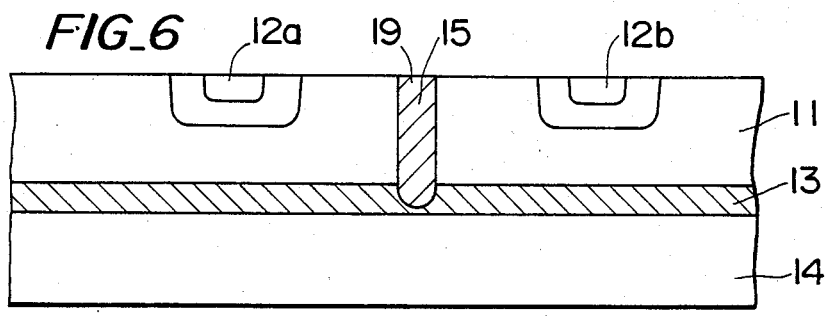
FIG_6
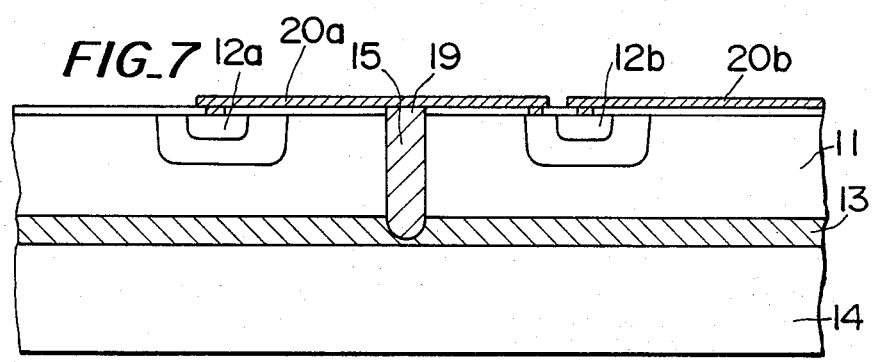
FIG_7
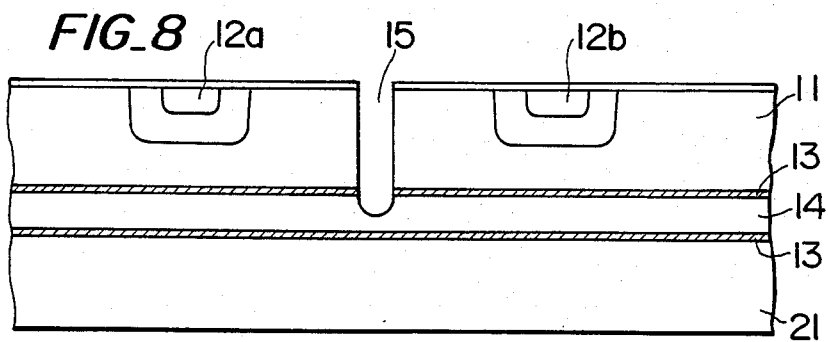
FIG_8

HIGH VOLTAGE INTEGRATED SEMICONDUCTOR DEVICES USING A THERMOPLASTIC RESIN LAYER

BACKGROUND OF THE INVENTION

This invention relates to a high voltage integrated semiconductor device having high voltage semiconductor elements which are isolated from each other by grooves. This structure increases the breakdown voltage across the high voltage semiconductor elements that form the semiconductor integrated circuit.

The dielectric isolating technique shown in FIG. 1 has been used for the purpose of increasing the breakdown strength to a value higher than several hundreds volts impressed across a plurality of high voltage semiconductor elements formed on a silicon monocrystalline substrate.

In the semiconductor device shown in FIG. 1, island regions 1 made of monocrystalline silicon and containing semiconductor element regions 4a and 4b are formed on such insulating films 2 as oxide films or nitride films which are formed on a polycrystalline silicon substrate 3. The insulating strength between the elements is afforded by the substrate 3.

Such a dielectric isolation method, however, requires extremely complicated steps of manufacturing the isolating substrate.

Where the semiconductor element regions 4a and 4b are formed in the island regions by a diffusion technique, there is such disadvantage that the substrate 3 undergoes deformation due to the difference in the thermal expansion coefficients of the island regions 1 and of the substrate 3 so that it is impossible to ensure high accuracy mask alignment during a photolithographic step in the wafer treatment.

Furthermore, crystal strains in the substrate caused by the deformation of the substrate decrease the junction breakdown strength in respective semiconductor elements and deteriorate other characteristics, which decreases the yield of satisfactory semiconductor devices.

SUMMARY OF THE INVENTION

Accordingly, it is an object of this invention to provide an improved high voltage integrated semiconductor device capable of obviating the various defects described above.

The object may be achieved by providing a high voltage integrated semiconductor device comprising:
a monocrystalline semiconductor substrate having on one surface thereof a plurality of high voltage active elements which are isolated from each other by physically-cut grooves;
a bismaleimide-triazine (BT) resin supporting plate for preventing mechanical deformation of said substrate and having a heat resistance property; and
an adhesive layer for attaching said supporting plate to an opposite surface of said substrate and having an electrically insulating property; wherein said grooves reach said supporting plate.

BRIEF DESCRIPTION OF THE DRAWINGS

In the accompanying drawings:

FIG. 1 is a sectional view of an integrated semiconductor device manufactured according to prior art dielectric isolating techniques;

FIGS. 2 to 4 are sectional views showing successive steps of manufacturing a semiconductor device according to this invention;

FIG. 5 is a sectional view showing a semiconductor device obtained by the steps shown in FIGS. 2 to 4 and mounted on a package;

FIGS. 6 and 7 are sectional views showing the steps of manufacturing the integrated semiconductor device according to the second embodiment of this invention; and FIG. 8 is a sectional view showing one step of manufacturing an integrated semiconductor device according to a third embodiment of this invention.

DESCRIPTION OF THE PREFERRED EMBODIMENTS

A first embodiment of the method of manufacturing an integrated semiconductor device is shown in FIGS. 2 to 4.

As shown in FIG. 2, high voltage semiconductor element regions 12a and 12b having planar construction are formed in selected surface portions of a monocrystalline silicon substrate 11 by using well known diffusion technique or the like. It is advantageous to limit the thickness of the monocrystalline silicon substrate 11 to about 0.3 mm because of the problems of heat dissipation and of handling wafers.

Then, as shown in FIG. 3, the monocrystalline silicon substrate 11 is attached to a holding plate 14 made of a BT (bismaleic imide triazin) resin with a silicone resin, or epoxy resin or glass type insulating adhesive material 13. The BT resin is a thermoplastic resinous material which contains as its principal constituents a triazin resin and bismaleimide-triazine and is heat resistant to 400° C. Where a BT resin plate which is reinforced with a glass reinforcing material is used as the supporting plate, its thermal expansion coefficient is about $10 \times 10^{-6}/°C$. in a temperature range of 0°–200° C. While the thermal expansion coefficient of silicon is about $3.5 \times 10^{-6}/°C$., it is possible to limit the deflection of the silicon substrate 11 to an extremely small value in the sandwich construction shown in FIG. 3.

Then, a groove 15 is formed through the monocrystalline silicon substrate 11 to reach the adhesive material at a portion between the semiconductor element regions 12a and 12b by using a dicing saw or a laser scriber. Although this physically cut groove 15 may reach a portion of the supporting plate 14, it is necessary to leave a sufficiently strong holding plate 14 for supporting the silicon substrate. Electrical isolation between the semiconductor element regions 12a and 12b is provided by the insulating supporting plate 14 and the groove 15.

One example of forming wiring between the semiconductor elements formed by the step shown in FIG. 4 and then mounting the assembly on a package is shown in FIG. 5.

More particularly, the wiring 18a and 18b formed on the surface of a package substrate 17 are respectively connected to the semiconductor element regions 12a and 12b through bump electrodes 12a and 12b. The wiring structure across the groove 15 which are prepared by a face down bonding technique utilizes the wirings 18a and 18b on the package substrate 17.

When PNPN elements having a breakdown voltage of 500 V were used as the semiconductor elements in the semiconductor element regions 12a and 12b to obtain a structure as shown in FIG. 5, the yield of the satisfactory products was found to increase to 90% from 40% for the products manufactured by the prior art dielectric isolating method.

FIGS. 6 and 7 show the second embodiment of this invention which enables interconnection between high voltage semiconductor elements on the same surface of a silicon substrate. After the step shown in FIG. 4, an insulator 19 having a high adhesive force against the silicon substrate 11, for example, such as a BT resin, a polyimide resin or low melting point glass is filled in the groove 15 to the surface of the substrate 11. Then, an aluminum wiring layer 20a is applied on the top of the insulator 19 to electrically interconnect the semiconductor element regions 12a and 12b, and an aluminum wiring layer 20b is applied on the top of the region 12b to connect the same to another semiconductor element region.

With the construction shown in FIG. 7, since it is possible to form wiring layers on the same plane of the silicon substrate in the same manner as a conventional integrated circuit device, it becomes easy to fabricate a high voltage semiconductor element into an integrated circuit device which a high density.

FIG. 8 shows the third embodiment of this invention. More particularly, following the step shown in FIG. 4, the holding plate 14 made of a BT resin and a second monocrystalline silicon substrate 21 are attached together with an additional layer 13 an adhesive material to form a sandwich structure.

In FIG. 8, since the thermal expansion coefficients of the surface of the holding plate 14 and of the rear surface of the silicon substrate 11 are quite the same, it is possible to prevent the breakage of the substrate, due to the deflection of the substrate due to such mechanical stress as chip bonding, and to the thermal stress due to oxidation and diffusion, and to prevent peel off of the silicon substrates 11 and 21 from the holding plate 14.

Although in the foregoing embodiments the holding plate 14 was attached to the silicon substrate with an adhesive material such as a BT resin, when a semicured BT resin plate (preplaque plate) is used as the holding plate 14, it is possible to obtain a sandwich structure with a heat press process, which can eliminate any special adhesive material.

As above described, according to the method of this invention, it is possible to readily improve the insulating strength between high voltage semiconductor elements formed on a monocrystalline substrate. Moreover, it is much easier to fabricate the elements into an integrated circuit device at a higher density and yield than the dielectric isolation method. Thus, it will be clear that the method of this invention is suitable for manufacturing PNPN elements utilized to switch an electrical circuit at a voltage which is higher than several hundreds volts.

What is claimed is:

1. A high voltage integrated semiconductor device comprising:
 a monocrystalline semiconductor substrate having on one surface thereof a plurality of high voltage active elements which are isolated from each other by physically-cut grooves;
 a bismaleimide-triazine (BT) resin supporting plate for preventing mechanical deformation of said substrate and having a heat resistant property; and
 an adhesive layer for attaching said supporting plate to an opposite surface of said substrate and having an electrically insulating property; wherein said grooves reach said supporting plate.

2. A semiconductor device according to claim 1, wherein said monocrystalline semiconductor substrate is a silicon substrate.

3. A semiconductor device according to claim 2, wherein said adhesive layer is of an electrically insulating material selected from the group consisting of a silicone resin, an epoxy resin and glass and wherein said supporting plate is heat resistant to about 400° C.

4. A semiconductor device according to claim 3, wherein said supporting plate is a glass reinforced BT resin plate.

5. A semiconductor device according to claim 3, wherein said grooves are filled with an electrically insulating material selected from the group consisting of BT resin, a polyimide resin and glass having a low melting temperature and wherein said active elements are electrically interconnected by aluminum layers.

6. A semiconductor device according to claim 3, wherein said silicon substrate is about 0.3 mm in thickness.

7. A semiconductor device according to claim 6, wherein at least one of said active elements in a PNPN device.

8. A high voltage integrated semiconductor device comprising:
 a monocrystalline semiconductor substrate having on one surface thereof a plurality of high voltage active elements which are isolated from each other by physically-cut grooves; said elements having bump electrodes;
 a bismaleimide-triazine (BT) resin supporting plate for preventing mechanical deformation of said substrate and having a heat resistance property;
 an adhesive layer for attaching said supporting plate to an opposite surface of said substrate and having an electrically insulating property; and
 another substrate for packaging said substrate and having a plurality of conductive layers on a surface thereof; said bump electrodes being electrically bonded to said conductive layers on the surface of said another substrate; wherein said grooves reach said supporting plate.

9. A semiconductor device according to claim 8, wherein said monocrystalline semiconductor substrate is a silicon substrate.

10. A semiconductor device according to claim 9, wherein said adhesive layer is of an insulating material selected from the group consisting of a silicone resin, an epoxy resin and glass and wherein said supporting plate is heat resistant to about 400° C.

11. A semiconductor device according to claim 10, wherein at least one of said active elements is a PNPN device.

12. A high voltage integrated semiconductor device comprising:
 a first silicon substrate having on the surface thereof a plurality of high voltage active elements which are isolated from each other by physically-cut grooves;
 a second silicon substrate for preventing mechanical deformation of said first silicon substrate; and a semi-cured bismaleimide-triazine (BT) resin plate which is sandwitched between an opposite surface of said first silicon substrate and said one surface of said first second silicon substrate by melting a surface of said BT resin plate by a thermocompression; wherein said grooves reach said BT resin plate.

13. A semiconductor device according to claim 12, wherein at least one of said active elements is a PNPN device.

14. A semiconductor device according to claim 12, wherein said BT resin plate is reinforced with a glass material.

* * * * *